(12) United States Patent
Maeda

(10) Patent No.: US 7,701,265 B2
(45) Date of Patent: Apr. 20, 2010

(54) POWER-ON RESET CIRCUIT USING FLIP-FLOP AND SEMICONDUCTOR DEVICE HAVING SUCH POWER-ON RESET CIRCUIT

(75) Inventor: Kazunori Maeda, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/783,293

(22) Filed: Apr. 6, 2007

(65) Prior Publication Data

US 2007/0236265 A1 Oct. 11, 2007

(30) Foreign Application Priority Data

Apr. 11, 2006 (JP) .............................. 2006-108762

(51) Int. Cl.
*H03L 7/00* (2006.01)
(52) U.S. Cl. ....................... 327/143; 327/142
(58) Field of Classification Search ................. 327/142, 327/143, 198, 217
See application file for complete search history.

(56) References Cited

U.S. PATENT DOCUMENTS

| | | | | |
|---|---|---|---|---|
| 4,730,131 A | * | 3/1988 | Sauer | 326/24 |
| 5,323,066 A | * | 6/1994 | Feddeler et al. | 327/142 |
| 5,606,269 A | * | 2/1997 | Pontius et al. | 326/93 |
| 6,853,396 B1 | * | 2/2005 | Omae | 347/237 |
| 6,914,462 B2 | * | 7/2005 | Kim et al. | 327/143 |
| 2001/0054921 A1 | | 12/2001 | Akiyoshi | |
| 2003/0020525 A1 | * | 1/2003 | Shigemasa et al. | 327/143 |
| 2005/0007170 A1 | * | 1/2005 | Nakahara et al. | 327/199 |
| 2005/0184770 A1 | * | 8/2005 | Sohn et al. | 327/143 |
| 2007/0024569 A1 | * | 2/2007 | Koyama et al. | 345/100 |

FOREIGN PATENT DOCUMENTS

| | | |
|---|---|---|
| JP | 60-020222 | 2/1985 |
| JP | 60-189029 | 9/1985 |
| JP | 61-198914 | 9/1986 |
| JP | 04-162820 | 6/1992 |
| JP | 04-355809 | 12/1992 |
| JP | 05-314789 | 11/1993 |
| JP | 8-111089 | 4/1996 |
| JP | 2001-273054 | 10/2001 |
| JP | 2002-009601 | 1/2002 |

OTHER PUBLICATIONS

Japanese Office Action dated May 7, 2008.
Japanese Office Action dated Mar. 4, 2009 with Partial English Translation.

* cited by examiner

*Primary Examiner*—Lincoln Donovan
*Assistant Examiner*—Adam D Houston
(74) *Attorney, Agent, or Firm*—McGinn Intellectual Property Law Group, PLLC

(57) ABSTRACT

A power-on reset circuit has a dummy flip-flop in addition to a setting flip-flop. Even if resetting is not performed by a power-on reset signal at power-on, output from the dummy flip-flop is used to perform resetting and initialization.

20 Claims, 4 Drawing Sheets

POWER-ON RESET CIRCUIT USING FLIP-FLOP AND SEMICONDUCTOR DEVICE HAVING SUCH POWER-ON RESET CIRCUIT

This application claims priority to prior Japanese patent application JP2006-108762, the disclosure of which is incorporated herein by reference.

BACKGROUND OF THE INVENTION

The present invention relates to a power-on reset circuit for use in a semiconductor device, particularly to a power-on reset circuit for preventing malfunction of a semiconductor device at power-on, and also relates to a semiconductor device having such a power-on reset circuit.

Recent semiconductor devices, which have been sophisticated and systematized, incorporate many functions. In order to have these functions work correctly according to commands from the outside, the commands must be held. A latch circuit such as a flip-flop is mainly used to store command information externally input, and internal circuit operation is controlled according to the stored command information. The latch circuit such as a flip-flop is initialized to a reset state by using a power-on reset signal at power-on to prevent malfunction of the internal circuit. The resetting of the latch circuit at power-on is performed by a circuit called a power-on reset circuit.

However, there are a variety of power-on methods depending on various systems, and they are different in the rising speed of the power source and the manners of change thereof (for example, the power may rise smoothly or stepwise). Therefore, there sometimes occurs a condition that has not been considered in simulation of a circuit for outputting a power-on reset signal. This condition may lead to a phenomenon that resetting cannot be performed properly. Thus, consideration must be given to a case in which the power-on reset signal does not operate properly to reset the latch circuit at power-on. For this purpose, the latch circuit is designed so that it readily becomes a reset state. In this respect, a method is known to adjust transistor sizes to configure a latch circuit such that the circuit is easy to be shifted to a specific direction (an expected value level or reset state at power-on). However, such method is not perfect.

When the power-on reset circuit outputs a latch signal different from an expected value at power-on, the latch circuit is often set to a special kind of mode. For example, if the latch circuit is set to a mode to stop internal power source for power saving, the circuit may be subsequently unable to operate normally (unless the circuit is reset). Moreover, following the increase of the number of functions incorporated in a semiconductor device, the number of latch circuits to latch commands has also been increased to cope with those functions. It becomes important to reliably initialize these many latch circuits to the reset state at power-on. Therefore, there is a demand for a power-on reset circuit that is applicable to a variety of systems without causing malfunction during power-on.

Referring to FIGS. 1 and 2, power-on reset circuits of the related art will be described. FIG. 1 shows a power-on reset circuit having an RS-flip-flop as a latch circuit, and the flip-flop is formed by an NAND circuit. FIG. 2 is a circuit block diagram of the RS-flip-flop 71 in the level of transistors. The flip-flop 71 receives an inverted signal SB of a set signal S7 as set input, and an output signal RB from an NOR circuit receiving a reset signal R7 and a power-on reset signal PON7, as a reset signal, and outputs output 7A. An inverted signal of the output 7A from the flip-flop 71 is a latch signal T7.

In the case of the logical configuration shown in FIG. 1, the power-on reset signal PON7 is a signal that becomes "H" level only during power-on. The reset signal R7 is a reset signal that is generated according to normal (regular) input from the outside. For example, the reset signal R7 may be a mode register set command used in an SDRAM. Therefore, the reset signal R7 remains "L" level during power-on. The power-on reset circuit shown in FIG. 1 resets the flip-flop 71 by the NOR of the reset signal R7 and the power-on reset signal PON7. When the power source rises, the flip-flop 71 is reset by the power-on reset signal PON7 becoming "H" level in a pulsed manner, and the latch signal T7 is set to the expected value, "L" level. The set signal S7 is a signal that is input when the latch signal T7 is to be activated (when the latch signal T7 is to be shifted to "H" level in the case of the logical configuration of FIG. 1).

In the configuration of FIG. 1, it is by the power-on reset signal PON7 that the latch signal T7 is set to the expected value, "L" level at power-on. In the event that no power-on reset signal PON7 is generated, the latch signal T7 will become indefinite. If the latch signal T7 becomes "H" level instead of the expected value, the mode may be set to an unexpected one, causing failure in operation of the internal circuit. In consideration of a case in which no power-on reset signal PON7 is generated, it is also proposed to design the flip-flop 71 such that the flip-flop 71 is readily shifted to the expected value (reset state) at power-on.

FIG. 2 is a circuit block diagram showing the flip-flop 71 in the transistor level. In order to turn the latch signal T7 to the expected value or "L" level at power-on, an output contact 7A must be at "H" level. The output contact 7A can be made easy to be shifted to "H" level at power-on, for example by designing the sizes of transistors such that: the capacity of transistors P1 and P2 is smaller than the capacity of transistors P3 and P4; and the capacity of transistors N1 and N2 is greater than the capacity of transistors N3 and N4. In general, a flip-flop is made symmetrical by balancing the capacities of its inverter circuits. However, this flip-flop is made asymmetrical and designed such that one of the output levels is easier to output at power-on. When the flip-flop is made to output one of the output levels, for example "H" level more easily, it is represented that the flip-flop is made easy to be shifted to "H" level.

The capacity setting for the transistors in this case are adjusted in such a manner that, in order to increase the capacity of a transistor, for example, the channel width of the transistor is set relatively large or the channel length is set relatively short. Thus, the power-on reset signal generated at power-on and the sizes of the transistors in the latch circuit are devised so as to avoid malfunction during power-on. However, when such a latch circuit is practically used in various systems, these measures sometimes are not valid to solve the problems, resulting in failure of resetting. Therefore, there is a demand for a power-on reset circuit having simple configuration and yet capable of reliably realizing an expected value.

The power-on resetting at power-on is described in prior patent publications as follows. Japanese Laid-Open Patent Publication NO. H08-111089 (Patent Publication 1) describes a technique in which the resetting is performed by generating a new power-on reset signal having a long pulse width from a precharged signal and a normal power-on reset signal. This new power-on reset signal having a long pulse width eliminates the effect of the rising up of the power source. Japanese Laid-Open Patent Publication NO. 2001-273054 (Patent Publication 2) describes a technique in which initialization at power-on is performing by monitoring and setting the output value of a latch circuit so as to prevent the through current. The power-on resetting techniques as described in the prior patent publications above are not applicable universally. Therefore, there is a demand for a power-on reset circuit having simple configuration and yet capable of realizing an expected value (reset state) more reliably.

SUMMARY OF THE INVENTION

The aforementioned semiconductor devices have a problem that initialization by a power-on reset signal cannot be performed successfully at power-on so that a latch signal is set to a mode different from an expected value, leading to malfunction. In view of the problem described above, it is an object of the present invention to provide a power-on reset circuit which is capable of performing initialization at power-on more reliably to prevent malfunction, and a semiconductor device having such a power-on reset circuit and capable of stable operation.

In order to achieve the object above, the present invention basically employs techniques as described below. It will be obvious that other applied techniques that can be modified variously without departing from the gist of the basic techniques are also included in the present invention.

A power-on reset circuit of the present invention includes a setting flip-flop and a dummy flip-flop each of which has a set terminal and a reset terminal, and a latch signal is reset to an inactive level at power-on by the setting flip-flop and the dummy flip-flop.

In the power-on reset circuit according to the present invention, the setting flip-flop is configured asymmetrical to become a reset state at power-on.

The power-on reset circuit according to the present invention further includes a logic circuit, and the logic circuit receives, as input, output from the setting flip-flop and output from the dummy flip-flop, and outputs a latch signal at an inactive level upon receiving at least one of the signals.

In the power-on reset circuit according to the present invention, the dummy flip-flop is configured asymmetrical to become a non-reset state at power-on, and the set terminal is fixed at a constant potential.

In the power-on reset circuit according to the present invention, the dummy flip-flop is arranged close to the setting flip-flop, and is configured to have characteristics relating to easiness of state-shifting ranged from a characteristic of being easy to be shifted to the non-reset state at power-on to a characteristic of being easy to be shifted to the reset state that is equivalent to that of the setting flip-flop, the set terminal being fixed at a constant potential.

In the power-on reset circuit according to the present invention, the dummy flip-flop is provided in a plurality of numbers and arranged close to the setting flip-flop, the set terminals of the respective dummy flip-flops being fixed at a constant potential.

In the power-on reset circuit according to the present invention, the plurality of dummy flip-flops are configured to have a characteristic of being easy to be shifted to the reset state that is equivalent to that of the setting flip-flop.

In the power-on reset circuit according to the present invention, each of the plurality of dummy flip-flops is configured to have characteristics relating to easiness of state-shifting ranged from a characteristic of being easy to be shifted to the non-reset state at power-on to a characteristic of being easy to be shifted to the reset state that is equivalent to that of the setting flip-flop.

In the power-on reset circuit according to the present invention, the dummy flip-flop is configured to have a characteristic of being easy to be shifted to the reset state that is equivalent to that of the setting flip-flop, and upon receiving a different set signal at the set terminal thereof, the dummy flip-flop outputs a different latch signal.

In the power-on reset circuit according to the present invention, the setting flip-flop is configured as a symmetrical flip-flop, while the dummy flip-flop is configured as an asymmetrical flip-flop which is easy to be shifted to a direction in which the latch signal is reset to the inactive level at power-on.

A semiconductor device according to the present invention has any one of the above-mentioned power-on reset circuits.

The power-on reset circuit according to the present invention has a dummy flip-flop in addition to a setting flip-flop. Even if initialization is not performed by a power-on reset signal at power-on, resetting and the initialization can be performed by using output from the dummy flip-flop. The power-on reset circuit according to the present invention is particularly effective when used in a mode setting latch circuit of a semiconductor device. For example, it is usable in a mode register of a DRAM which is a semiconductor memory device. EMRS 1 (Extended Mode Register 1) of a DDRII DRAM has settings for the OCD drive mode. If the OCD drive mode is erroneously entered at power-on, the output becomes Low-Z. The present invention, when applied to such a latch circuit, is capable of avoiding these problems liable to occur at power-on. The provision of a dummy flip-flop makes it possible to provide a power-on reset circuit and a semiconductor device capable of more reliable initialization at power-on.

DESCRIPTION OF THE PREFERRED EMBODIMENTS

A power-on reset circuit using a flip-flop according to the present invention, and semiconductor device having such a power-on reset circuit will be described with reference to the accompanying drawings.

First Embodiment

Figure 3:
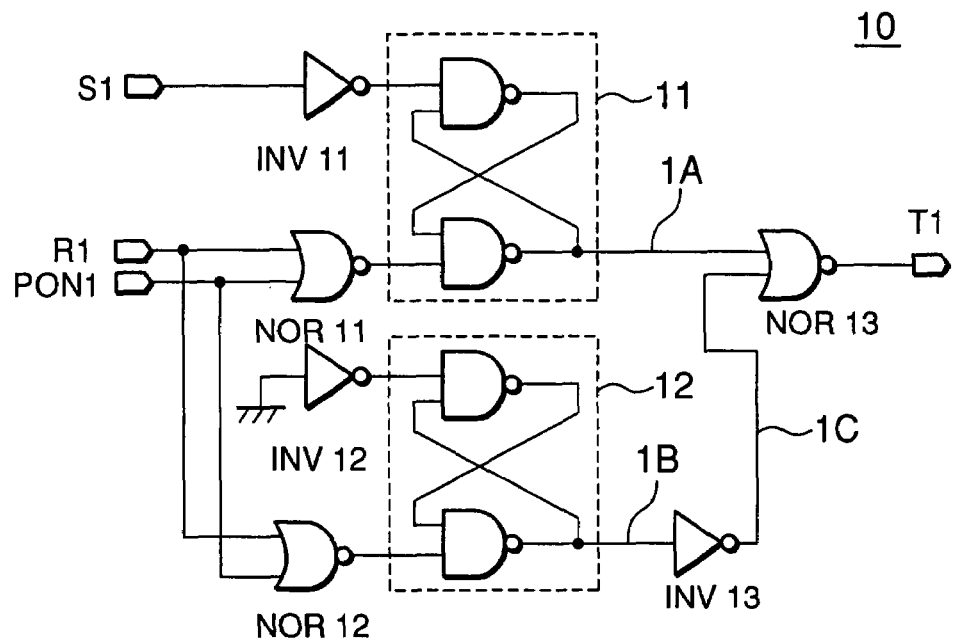
FIG. 3 is a first power-on reset circuit diagram according to a first embodiment of the present invention.
Figure 4:
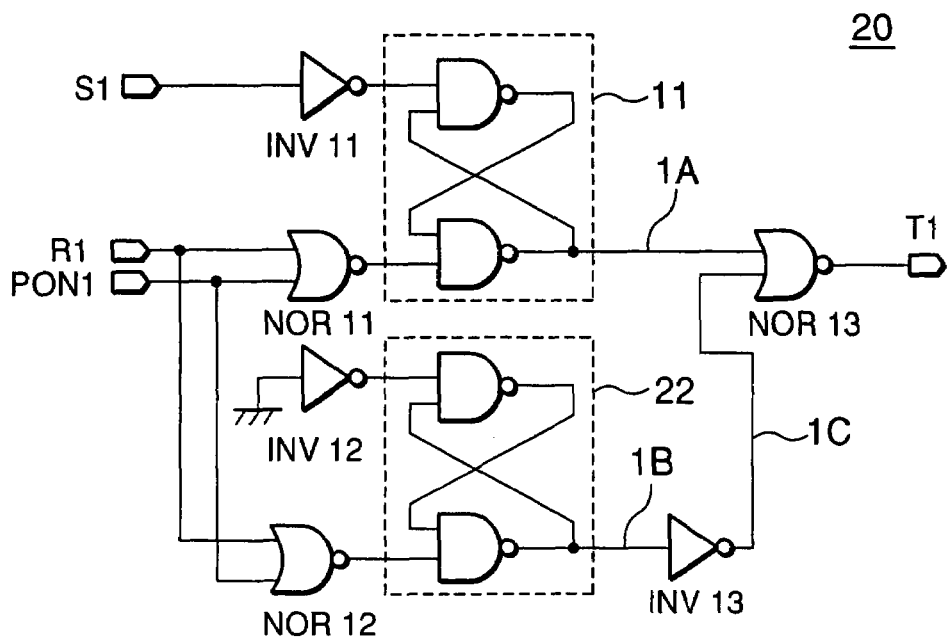
FIG. 4 is a second power-on reset circuit diagram according to the first embodiment of the present invention.

A first embodiment of the present invention will be described with reference to FIGS. 3 and 4. FIGS. 3 and 4 show a power-on reset circuit using a flip-flop. A power-on reset circuit 10 shown in FIG. 3 is composed of flip-flops 11 and 12, inverter circuits INV11, INV12 and INV13, and NOR circuits NOR11, NOR12 and NOR13. A power-on reset circuit 20 shown in FIG. 4 has same configuration as that of the power-on reset circuit 10 except that the flip-flop 12 of the power-on reset circuit 10 of FIG. 3 is replaced with a flip-flop 22.

The flip-flop 11 in the power-on reset circuit 10 receives, as set input, a set signal S1 after being inverted by the inverter circuit INV11. The flip-flop 11 receives, as reset input, an output signal from the NOR circuit NOR11 receiving a reset signal R1 and a power-on reset signal PON1 as input. The flip-flop 12 receives, as set input, output from the inverter circuit INV12 receiving an input signal having ground potential. The flip-flop 12 receives, as reset input, an output signal from the NOR circuit NOR12 receiving a reset signal R1 and a power-on reset signal PON1 as input. Upon receiving output 1A from the flip-flop 11 and an output signal 1C obtained by inverting output 1B from the flip-flop 12 by the inverter circuit INV13, the NOR circuit NOR13 outputs a latch signal T1.

Figure 2:
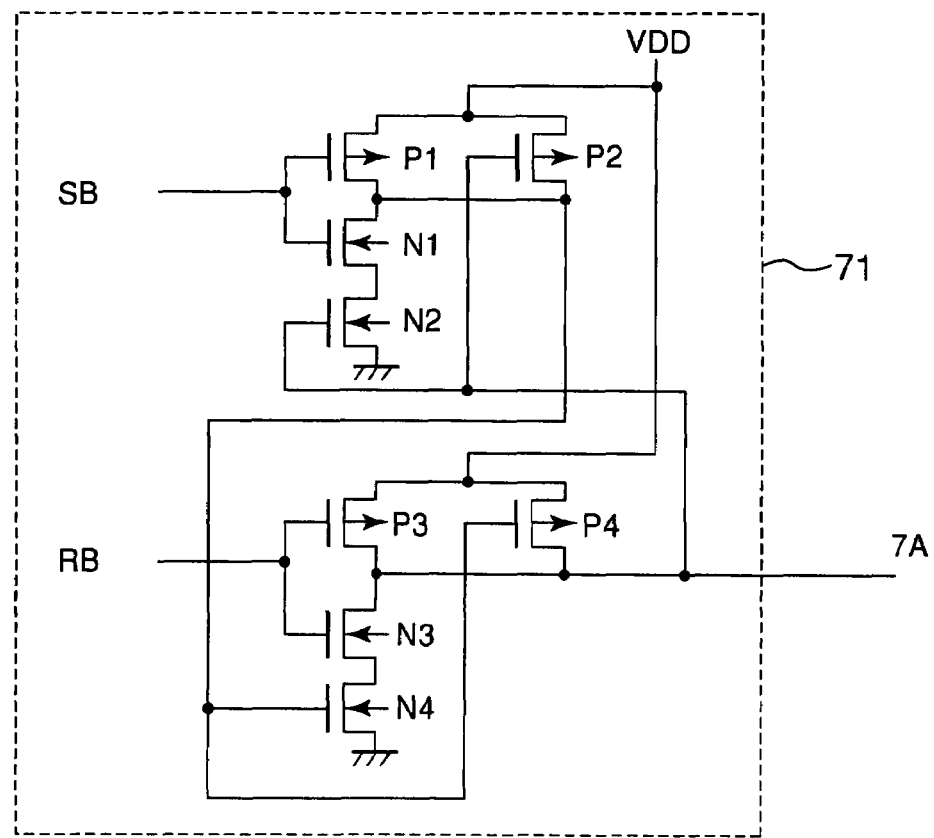
FIG. 2 is a transistor-level circuit diagram of a flip-flop according to the related art.

Herein, the flip-flops 11 and 12 are arranged close to each other and in similar layouts. The sizes of transistors of the flip-flop 11 are adjusted such that the output contact 1A is easily shifted to "H" level, or the reset state at power-on. On the contrary, the sizes of transistors of the flip-flop 12 are adjusted such that the output contact 1B is easily shifted to "L" level at power-on. When internal circuits of these flip-flops 11 and 12 are configured similarly to a related one (the one shown in FIG. 2, for example), the sizes of the transistors of the flip-flop 11 may be set such that the capacity of the transistors P1 and P2 is smaller than the capacity of the transistors P3 and P4, and the capacity of the transistors N1 and N2 is greater than the capacity of the transistors N3 and N4. The size of the transistors of the flip-flop 12 may be set such that the capacity ratios of the transistors become opposite to those of the flip-flop 11. In this manner, the flip-flops 11 and 12 are designed such that their outputs are easily shifted to the opposite output levels.

Subsequently, description will be made of basic operation of the power-on reset circuit.

The set signal S1, the reset signal R1, and the power-on reset signal PON1 are initially at the "L" level immediately after power-on. The rise of the power source voltage changes the power-on reset signal PON1 to "H" level so that the flip-flops 11 and 12 are reset. The output contacts 1A and 1B of the flip-flops 11 and 12 are changed to "H" level, while the latch signal T1 becomes "L" level. The power-on resetting can be performed normally by the latch signal T1 being changed to "L" level. After the power source voltage has been stabilized sufficiently, the resetting is performed by the reset signal R1. Further, the flip-flop 11 is set by the set signal S1 and the latch signal T1 is activated to establish a set state. The flip-flop 12 is reset by the reset signal R1. However, since the set signal is at a fixed potential (the ground potential, herein), the output of the flip-flop 12 remains fixed. The flip-flop 12 is used only for resetting.

Figure 1:
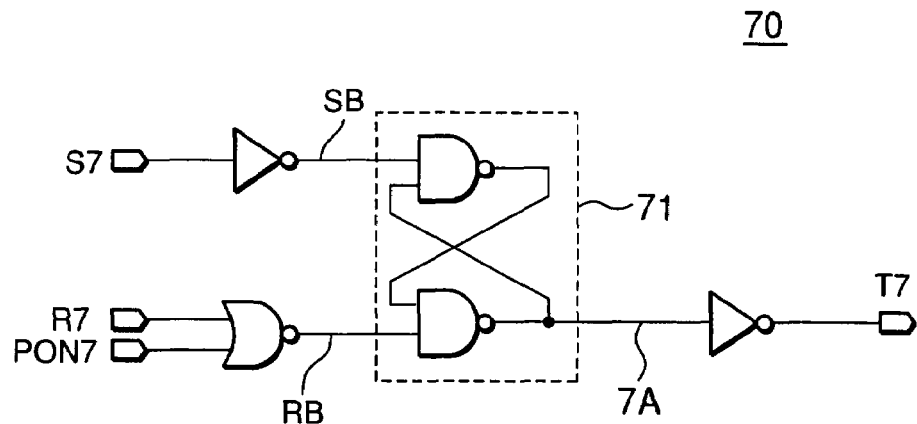
FIG. 1 is a power-on reset circuit diagram according to a related art.

However, depending on some power source rising conditions, the power-on reset signal does not work normally and the flip-flop 11 outputs "L" level. When this occurs, the power-on reset circuit according to the related art shown in FIG. 1 will malfunction, the latch signal being activated. According to the present invention, however, the flip-flops 11 and 12 are designed to be easily shifted to opposite output levels. Accordingly, when the flip-flop 11 is shifted to "L" level, the flip-flop 12, which is inherently easily shifted to "L" level, is reliably shifted to "L" level. The output 1B of the flip-flop 12 becomes "L" level, and output of the inverter circuit INV13 becomes "H" level. As a result, the latch signal T1 that is output of the NOR circuit NOR13 can be set to the expected value, or "L" level to establish a reset state.

When the flip-flops 11 and 12 are shifted to "L" level at power-on, the latch signal T1 becomes "L" level, preventing malfunction. Since the output contact 1C is at "H" level in this state, the latch signal T1 cannot be "H" level even if the set signal S1 is activated. However, during ordinary use, a reset signal R1 will be input before inputting a set signal S1. The circuit is once reset by the reset signal R1 generated by normal (regular) input from the outside. Consequently, the output contact 1A is shifted to "H" level, the output contact 1B is shifted to "H" level, and the output contact 1C is shifted to "L" level. According to the present invention, therefore, no problem will occur during ordinary use even if the output contact 1B becomes "L" level and the output contact 1C becomes "H" level at power-on.

In this embodiment, the flip-flop 12 is added for the purpose of preventing malfunction during power-on. Once the flip-flop 12 is reset by the reset signal R1, the set signal is fixed to the ground potential. Thus, the output of the flip-flop 12 is fixed to "H" level, and the output contact 1C is fixed to "L" level. This means that the flip-flop 12 is a dummy flip-flop which will not operate during normal operation. In the following description, the flip-flop 12 as shown in FIG. 3 and used for this purpose will be referred to as the dummy flip-flop. On the other hand, the flip-flop 11, which latches a set signal, will be referred to as the setting flip-flop.

FIG. 4 shows a power-on reset circuit 20 provided with a dummy flip-flop having different configuration from that of the power-on reset circuit 10 in FIG. 3. The power-on reset circuits 10 and 20 shown in FIG. 3 and FIG. 4, respectively, have flip-flops 12 and 22 which differ from each other in the drive capacity of transistors. Transistor sizes of the flip-flop 22 shown in FIG. 4 are the same as those of the flip-flop 11. The other constituent elements are the same as those in FIG. 3, and therefore are designated by the same reference numerals and description thereof will be omitted.

The flip-flops 11 and 22 are designed, as much as possible, to have same transistor sizes, and to be arranged in the same layout and close to each other. The sizes of transistors of both the flip-flops 11 and 22 are adjusted such that the output contacts 1A and 1B are easily shifted to "H" level at power-on. If the internal circuits of the flip-flops 11 and 22 are configured in the same manner as in the related art (e.g., FIG. 2), the capacity of the transistors P1 and P2 is set smaller than the capacity of the transistors P3 and P4 and the capacity of the transistors N1 and N2 is set greater than the capacity of the transistors N3 and N4. In the power-on reset circuit 20, the flip-flops 11 and 22 are configured in the same manner, and are arranged in a same layout and close to each other so that they are affected by noise or the like in the same manner. Accordingly, when the flip-flop 11 is shifted oppositely to the expected value which is easy to shift to, the flip-flop 22 will also be shifted oppositely to the expected value which is easy to shift to.

If the power-on reset signal does not work normally in this power-on reset circuit 20 and the flip-flop 11 is shifted to "L" level, the flip-flop 22 will also be shifted to "L" level opposite to the expected value which is easy to shift to. Accordingly, the latch signal T1 that is output of the NOR circuit NOR13 receiving the output 1A of the flip-flop 11 and an inverted level of the output 1B of the flip-flop 12 can be set to the expected value, or "L" level. Thus, the latch signal T1 from the power-on reset circuit 20 is set to the reset state, or "L" level.

The sizes of transistors of the dummy flip-flop 12 in FIG. 3 are set to form an asymmetrical flip-flop which is easily shifted to "L" level. This dummy flip-flop 12 is an asymmetrical flip-flop of an opposite type which is easily shifted to an opposite output level to that of the setting flip-flop. On the other hand, the dummy flip-flop 22 shown in FIG. 4 is an asymmetrical flip-flop of a same type which is easily shifted to "H" level, the same output level as the setting flip-flop 11.

The sizes of transistors of the dummy flip-flop 2 are set to same sizes as those of the setting flip-flop 11. Further, the setting flip-flop 11 and the dummy flip-flop 22 are arranged, as much as possible, in a same layout and close to each other. Accordingly, when the output of the setting flip-flop 11 becomes an opposite level to the expected value, the output of the dummy flip-flop 22 also becomes the same level.

The addition of the dummy flip-flop enables resetting by the dummy flip-flop if the power-on reset signal does not work normally. The dummy flip-flop may be an asymmetrical flip-flop of an opposite type which is easily shifted to an opposite output level to the setting flip-flop. Alternatively, the dummy flip-flop may be an asymmetrical flip-flop of a same type and having same transistor sizes as the setting flip-flop. Thus, any of these types of flip-flops may be used as long as having either of these two types of characteristics relating to easiness of shifting.

The setting flip-flop of the power-on reset circuit is designed to have a characteristic that the output state at power-on is easily shifted to the reset state ("H" level). The dummy flip-flop may be either designed to have a characteristic that the output state is easily shifted to the reset state ("H" level), having a capacity equivalent to that of the setting flip-flop, or designed to have a characteristic that the output state is easily shifted to the non-reset state ("L" level) opposite to the reset state of the setting flip-flop. The flip-flop will not be reset if the flip-flop output becomes "L" level during power-on. This state of the flip-flop will herein be referred to as the non-reset state ("L" level).

In the description above, the setting flip-flop is of an asymmetrical type which is easy to shifted to one or the other level. However, the setting flip-flop may be a symmetrical flip-flop that is easy to be shifted to both levels. In this case, the dummy flip-flop is an asymmetrical flip-flop which is easy to be shifted to a direction in which the latch signal can be reliably set to the inactive level at power-on. The added dummy flip-flop is used only during power-on and does not affect the normal operation. This enables selection of a flip-flop having more asymmetric characteristic, and the reset state can be established more reliably by the dummy flip-flop thus added.

The power-on reset circuit of the first embodiment has the dummy flip-flop in addition to the setting flip-flop. During normal power-on operation, power-on resetting is performed by the setting flip-flop which has received a power-on reset signal. If the power-on reset signal does not work normally, the dummy flip-flop is used to perform the power-on resetting. Even if the power-on reset signal does not work and the flip-flop is shifted oppositely to the expected value, the malfunction during power-on can be prevented effectively by the added dummy flip-flop.

Second Embodiment

Figure 5:
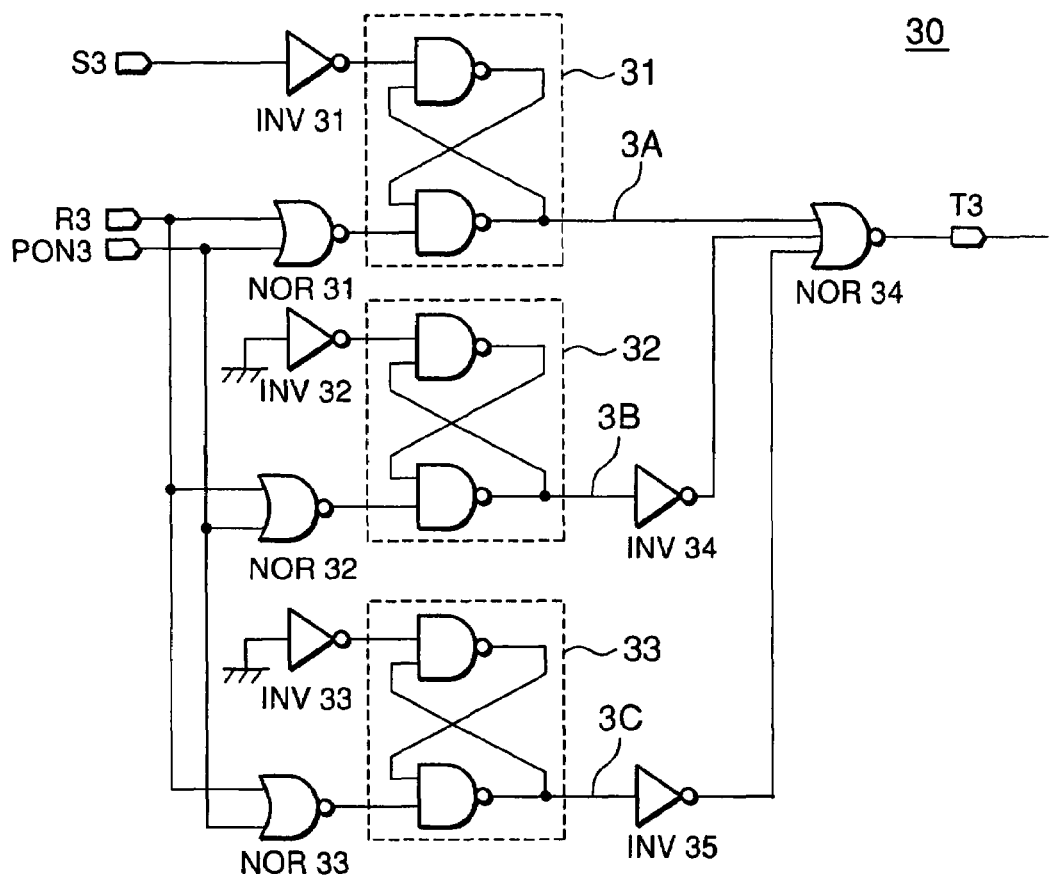
FIG. 5 is a first power-on reset circuit diagram according to a second embodiment of the present invention.
Figure 6:
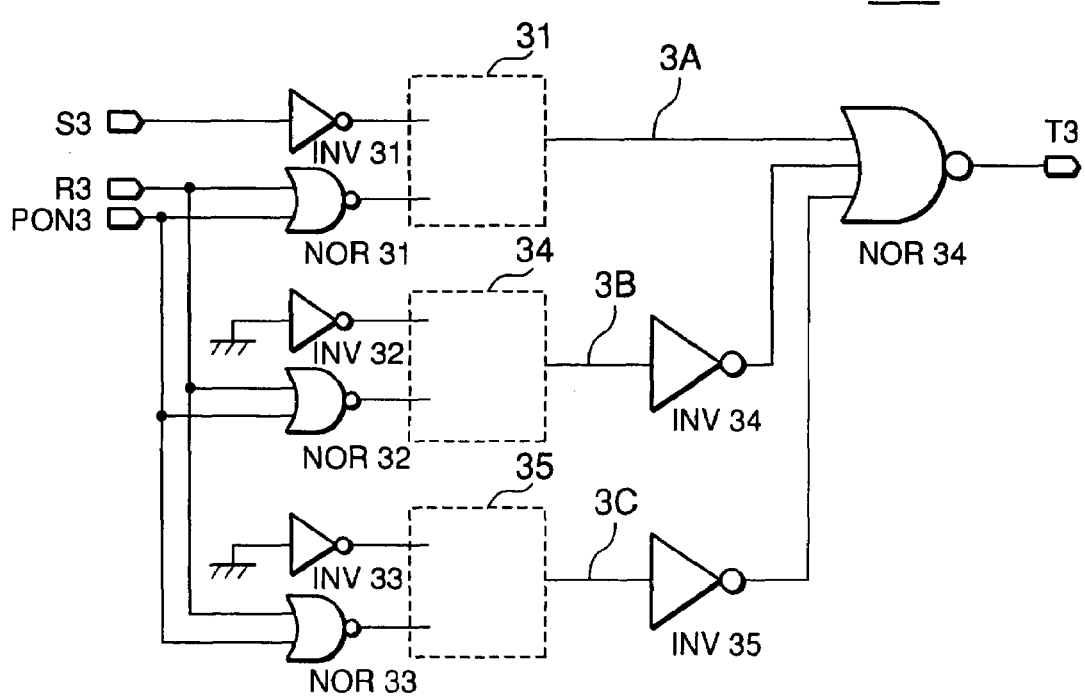
FIG. 6 is a second power-on reset circuit diagram according to the second embodiment of the present invention.

A second embodiment of the present invention will be described with reference to FIGS. 5 and 6. In this embodiment, the dummy flip-flop according to the first embodiment is multiplexed, and two dummy flip-flops are provided. FIG. 5 shows a first multiplexed power-on reset circuit 30, while FIG. 6 shows a modification thereof, a second multiplexed power-on reset circuit 30-1. The power-on reset circuit 30 shown in FIG. 5 is composed of a setting flip-flop 31, dummy flip-flops 32 and 33, inverter circuits INV31, INV32, INV33, INV34, and INV35, NOR circuits NOR31, NOR32, NOR33, and NOR34. The power-on reset circuit 30-1 shown in FIG. 6 has dummy flip-flops 34 and 35 in place of the dummy flip-flops 32 and 33 of FIG. 5, while the other configuration is the same as the power-on reset circuit 30.

The setting flip-flop 31 of the power-on reset circuit 30 receives, as set input, a set signal S3 after being inverted by the inverter circuit INV31. The setting flip-flop 31 receives, as reset input, an output signal from the NOR circuit NOR31 receiving a reset signal R3 and a power-on reset signal PON3. Output 3A from the setting flip-flop 31 is supplied to the NOR circuit NOR34. The dummy flip-flop 32 receives, as set input, output from the inverter circuit INV32 receiving an input signal at ground potential. The dummy flip-flop 32 receives, as reset input, an output signal from the NOR circuit NOR32 receiving the reset signal R3 and the power-on reset signal PON3. Output 3B from the dummy flip-flop 32 is supplied to the inverter circuit 34. Output of the inverter circuit 34 is supplied to the NOR circuit NOR34.

Similarly, the dummy flip-flop 33 receives, as set input, output from the inverter circuit INV33 receiving an input signal at ground potential. The dummy flip-flop 33 receives, as reset input, an output signal from the NOR circuit NOR33 receiving the reset signal R3 and the power-on reset signal PON3 as input. Output 3C from the dummy flip-flop 33 is supplied to the inverter circuit 35. Output from the inverter circuit 35 is supplied to the NOR circuit NOR34. The NOR circuit NOR34 receives the output 3A of the setting flip-flop 31, the output of the inverter circuit 34, and the output of the inverter circuit 35, and outputs a latch signal T3.

In the power-on reset circuit 30, the setting flip-flop 31 and the dummy flip-flop 32 have same configuration and same sizes of transistors, and both are asymmetrical flip-flops of a same type which are easy to be shifted to the reset state ("H" level) at power-on. The dummy flip-flop 33 is an asymmetrical flip-flop of an opposite type to that of the flip-flops 31 and 32, having an opposite capacity ratio of transistors to that of the flip-flops 31 and 32, so that the output contact 3C is easily shifted to the non-reset state ("L" level) at power-on. The layout of the dummy flip-flops 32 and 33 is similar to that of the flip-flop 31, and they are arranged close to each other.

When the power-on reset signal does not work normally and the setting flip-flop 31 is shifted to the non-reset state ("L" level) at power-on, the dummy flip-flops 32 and 33 are also easily shifted to the non-reset state ("L" level). When the dummy flip-flops 32 and 33 are shifted to the non-reset state ("L" level), the latch signal T3 is reset to "L" level by the inverted signals from the dummy flip-flops 32 and 33. Further, when the dummy flip-flop 33 is formed as a flip-flop which is easy to be shifted to the non-reset state ("L" level), the output contact 3C is easy to be shifted to "L" level no matter how the output contacts 3A and 3B are shifted at power-on. If the output contact 3C is set to the non-reset state ("L" level), the latch signal T3 can be set to the expected value, or "L" level.

Even if the power-on reset signal does not work normally during power-on, the plurality of dummy flip-flops can perform the power-on resetting to set the latch signal T3 to the expected value, or "L" level. When the set signal S3 is to be input during ordinary use, the output contacts 3A, 3B, and 3C are set to "H" level by the reset signal R3 before the input thereof. Therefore, even if the output contacts 3B and 3C are shifted to "L" level at power-on, no problem occurs in normal operation.

The power-on reset circuit 30-1 differs from the power-on reset circuit 30 in the fact the dummy flip-flops 32 and 33 are replaced with dummy flip-flops 34 and 35. The power-on reset circuit 30-1 is identical with the power-on reset circuit 30 in other respects. Therefore, the following description will be made of the dummy flip-flops. The dummy flip-flops 34 and 35 of the power-on reset circuit 30-1 are asymmetrical flip-flops of a same type and having same sizes of transistors as the setting flip-flop 31, which are easily shifted to the reset state ("H" level) at power-on. The dummy flip-flop 34 and 35 are arranged in a similar layout to that of the flip-flop 31 and close to each other.

With this structure, when the setting flip-flop 31 is shifted to the non-reset state ("L" level) opposite to the expected value, the dummy flip-flops 34 and 35 are also apt to shift to the non-reset state ("L" level) opposite to the expected value. Therefore, if at least one of the dummy flip-flops 34 and 35 is shifted to the non-reset state ("L" level), the latch signal T3 can be set to the expected value, or "L" level. The use of a plurality of dummy flip-flops decreases the probability that a plurality of outputs from the power-on reset circuit are combined to cause malfunction during power-on. As the number of the dummy flip-flops is increased, the probability of the latch signal being set correctly to an expected value during power-on is significantly increased.

The increase of the number of the dummy flip-flops thus enables reliable power-on resetting even if the power-on reset signal does not work normally. The dummy flip-flops may be a combination of flip-flops of opposite types having opposite expected values which they are apt to shift to at power-on, or a combination of flip-flops of a same type but having several different degrees of capacity ratio of transistors. The state which the flip-flop is apt to shift to at power-on depends on the capacity ratio of the transistors in the flip-flop. Thus, the increase of the number of the dummy flip-flops to multiplex the outputs thereof is a very effect method to prevent malfunction during power-on.

In order to bring these flip-flops to the reset state ("H" level), the transistor sizes may be set as follows if the flip-flops transistors configured as described above (see FIG. 2). The capacity of the transistors P1 and P2 may be set smaller than the capacity of the transistors P3 and P4, and the capacity of the transistors N1 and N2 may be set greater than the capacity of the transistors N3 and N4. On the contrary, in order to bring the flip-flop to the non-reset state ("L" level), the capacity of the transistors P1 and P2 may be set greater than the capacity of the transistors P3 and P4, and the capacity of the transistors N1 and N2 may be set smaller than the capacity of the transistors N3 and N4. Further, the degree of easiness with which the flip-flops are shifted to the reset state ("H" level) or to the non-reset state ("L" level) can be set as required by selecting the capacity ratios of the transistors.

One of the reasons to multiplex the dummy flip-flops as described above is a problem of short break of power source. That is, a situation may occur where the power source is turned off for a moment and is then turned on back again. When this occurs, the internal flip-flops are set to the state indicating the normal mode during the on-state of the power source before the short break. When the power source is turned off for a moment in this state, the state remains the same as the normal power-on state if internal nodes are discharged sufficiently. In contrast, if internal registers or the like are not discharged, the normal state is preserved in the power-on reset circuit when the power source is turned on back again. It is accordingly believed that the power-on reset circuit can thus be prevented from entering an abnormal mode and kept in the state-ready to normal reset.

However, when the power source is turned on back again after the short break, there may be a case in which the internal discharge is not enough and some contacts keep the state before the short break while some other contacts are completely discharged. When the internal state of the circuit is as this, the circuit will follow a transition process different from the normal power-on process, and the latch signal of the flip-flop may be different from the expected value. Therefore, the dummy flip-flops are multiplexed to ensure the reliable reset operation by the power-on reset circuit.

The power-on reset circuit according to the second embodiment has a plurality of dummy flip-flops. These dummy flip-flops may be configured as asymmetrical flip-flops of the same type as the setting flip-flop, or as asymmetrical flip-flops of an opposite type to that of the setting flip-flop. The provision of a plurality of dummy flip-flops, which are different in the output level which they are easy to be shifted to, makes it possible to prevent the power-on reset circuit from entering an abnormal mode even during short break of the power source and to ensure reliable power-on resetting. As the number of the latch circuits is increased, the probability that the latch signal is set to an expected value at power-on is also increased substantially.

Third Embodiment

Figure 7:
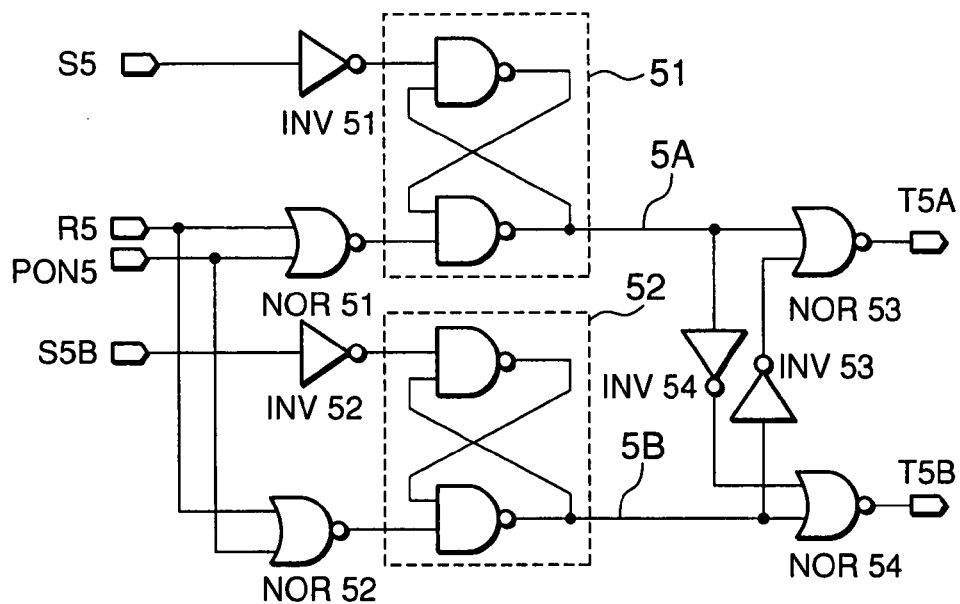
FIG. 7 is a first power-on reset circuit diagram according to a third embodiment of the present invention.
Figure 8:
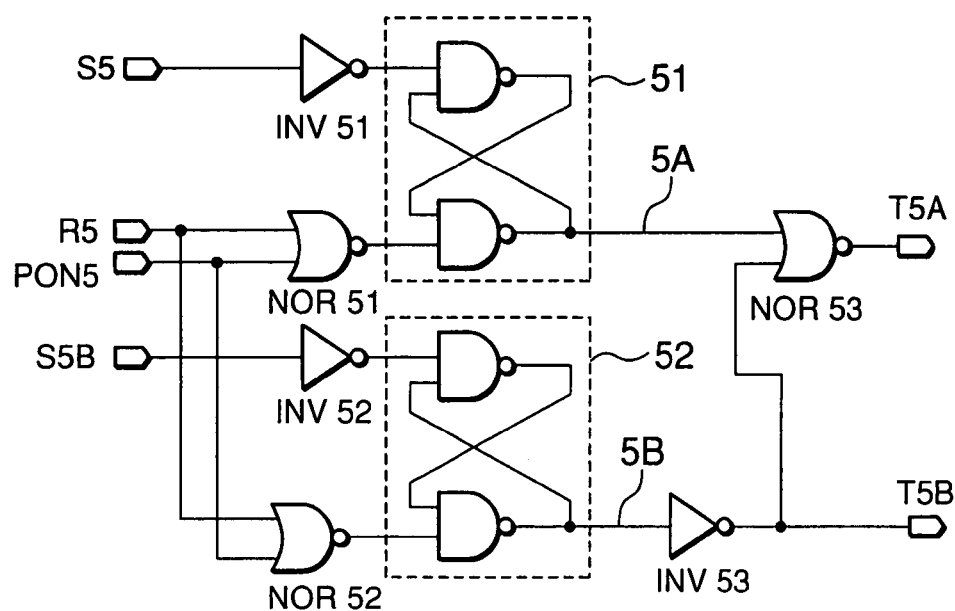
FIG. 8 is a second power-on reset circuit diagram according to the third embodiment of the present invention.

A third embodiment of the present invention will be described with reference to FIGS. 7 and 8. According to this embodiment, a flip-flop of a power-on reset circuit generating another latch signal is utilized as a dummy flip-flop. FIG. 7 shows a power-on reset circuit 50, while FIG. 8 shows a modification thereof, a power-on reset circuit 50-1.

In the first and second embodiments described above, the latch signal is set to an expected value at power-on by adding the dummy flip-flop. It is also described that the effect is enhanced as the number of the dummy flip-flops is increased. However, the increase of the number of the dummy flip-flops obviously leads to the increase of the chip surface area. The third embodiment relates to configuration for avoiding this. According to the third embodiment, latch signals T5A and T5B are output from flip-flops 51 and 52 and latch separate commands, respectively. These latch signals T5A and T5B are selected such that they are not activated simultaneously. The following description will be made, focusing on the latch signal T5A.

The power-on reset circuit 50 is composed of a setting flip-flop 51, a dummy flip-flop 52, inverter circuits INV51, INV52, INV53, and INV54, and NOR circuits NOR51, NOR52, NOR53, and NOR54. The setting flip-flop 51 receives, as set input, a set signal S5 after being inverted by the inverter circuit INV51. The setting flip-flop 51 receives, as reset input, an output signal from the NOR circuit NOR51 receiving the reset signal R5 and a power-on reset signal PON5 as input. The dummy flip-flop 52 receives, as set input, a set signal S5B after being inverted by the inverter circuit INV52. The dummy flip-flop 52 receives, as reset input, an output signal from the NOR circuit NOR52 receiving the reset signal R5 and the power-on reset signal PON5 as input. A latch signal T5A is output from the NOR circuit NOR53 receiving output 5A from the setting flip-flop 51 and an output signal from the inverter circuit INV53 which inverts output 5B of the dummy flip-flop 52.

As described above, the flip-flop 51 functions as a setting flip-flop while the flip-flop 52 functions as dummy flip-flop, with respect to the latch signal T5A. On the other hand, the flip-flop 52 functions as a setting flip-flop while the flip-flop 51 functions as a dummy flip-flop with respect to the latch signal T5B. Accordingly, the latch signal T5B is output from the NOR circuit NOR54 which receives the output 5B of the setting flip-flop 52 and the output signal from the inverter circuit INV54 inverting the output 5A from the dummy flip-flop 51. In this manner, the two flip-flops complement each other, one functioning as a setting flip-flop and the other functioning as a dummy flip-flop with respect to one of the latch signals. The basic operation of these flip-flops is the same as that of the first embodiment, and thus the description thereof is omitted.

It is assumed here that expected values for the latch signals T5A and T5B at power-on are both "L" level. Therefore, the flip-flops 51 and 52 are flip-flops which are easily shifted to the reset state ("H" level) at power-on. The flip-flops 51 and 52 are designed, as much as possible, to have same transistor sizes and to be arranged in the same layout and close to each other. If a power-on reset signal does not work normally at power-on, and the setting flip-flop 51 is shifted to the non-reset state ("L" level), the dummy flip-flop 52 is also shifted to the non-reset state ("L" level) opposite to the expected value. This makes it possible to set the latch signal T5A to the expected value, or "L" level. The latch signal T5A is output from the NOR circuit NOR53 receiving the output 5A from the setting flip-flop 51 and the inverted level of the output 5B from the dummy flip-flop 52. Similarly, the latch signal T5B also can be set to the expected value, or "L" level.

Consideration will be given to how the power-on reset circuit works during normal operation. The reset signal R5 is first input upon stabilization of the power source voltage, so that the output contacts 5A and 5B are brought to "H" level, and the latch signals T5A and T5B become "L" level. The latch signal T5A is brought to "H" level and activated by the input of the set signal S5A. While this latch signal T5A is active, the latch signal T5B cannot be activated even if the set signal S5B is input. However, as described above, the latch signals T5A and T5B are selected such that they are not activated simultaneously. Therefore, there is no problem if the latch signal T5A is used in the inactive state when the latch signal T5B is to be activated. On the contrary, when the latch signal T5A is to be activated, the latch signal T5B can be used in the inactive state.

In the power-on reset circuit 50-1 shown in FIG. 8, the logic processing of the outputs 5A and 5B from the flip-flops of the power-on reset circuit 50 is altered. The latch signal T5B is directly output from the inverter circuit INV53 with the inverter circuit 54 and the NOR circuit NOR54 being omitted. For example, the latch signal T5A will induce a problem if it is shifted to the opposite level to the expected value (to "H" level in case of the logic shown in FIG. 7) at power-on. Therefore, the latch signal T5A must be prevented from malfunction during power-on. In contrast, however, the latch signal T5B need not be prevented from malfunction during power-on if it can be at an undefined level during power-on. In such a case, the configuration to prevent the malfunction during power-on is applied only to the latch signal T5A.

The power-on reset circuit according to the third embodiment is able to reduce the area occupied by the dummy flip-flop by combining latch signals which are not activated simultaneously during normal use. The latch signals which are not activated simultaneously are combined so that the setting flip-flop corresponding to one of the latch signals is caused to function as the dummy flip-flop for the other latch signal. According to this configuration, if the power-on reset signal does not work normally and the setting flip-flop is shifted to the opposite level to the expected value, the other flip-flop can be caused to function as the dummy flip-flop to prevent malfunction during power-on.

Although the present invention has been described specifically based on preferred embodiments, the present invention is not limited to these embodiments but may be otherwise variously embodied without departing from the scope or spirit of the invention. All these changes and modifications are obviously covered by the present invention. For example, in the description above, a latch signal is generated by the NOR circuit receiving, as input, the output from the setting flip-flop and an inverted signal of the output from the dummy flip-flop. However, the logic circuit is not limited to the NOR circuit, but any other logic circuit may be used to set the latch signal to the reset state.

What is claimed is:

1. A semiconductor device wherein a latch signal is reset to an inactive level in response to a power-on reset signal, comprising:
 a setting asynchronous set-reset SR (set-reset) flip-flop comprising a set terminal and a reset terminal, the reset terminal of the setting asynchronous set-reset SR flip-flop receiving a first reset input based on one of a reset signal and the power-on reset signal;
 a dummy asynchronous SR (set-reset) flip-flop comprising a set terminal and a reset terminal, the set terminal of the dummy asynchronous SR flip-flop being fixed at a constant potential and being free from receiving any signals, the reset terminal of the dummy asynchronous SR flip-flop receiving a second reset input based on one of the reset signal and the power-on reset signal; and
 a logic circuit receiving, as an input, an output signal from said setting asynchronous SR flip-flop and an output signal from said dummy asynchronous SR flip-flop, and outputting a latch signal at an inactive level upon receiving at least one of said output signals.

2. The semiconductor device according to claim 1, wherein the setting asynchronous SR flip-flop is configured asymmetrical to become a reset state at power-on.

3. The semiconductor device according to claim 2, wherein the dummy asynchronous SR flip-flop is configured asymmetrical to become a non-reset state at power-on.

4. The semiconductor device according to claim 2, wherein the dummy asynchronous SR flip-flop is arranged close to the setting asynchronous SR flip-flop, and is configured to have characteristics relating to easiness of state-shifting ranged from a characteristic of being easy to be shifted to the non-reset state at power-on to a characteristic of being easy to be shifted to the reset state that is equivalent to that of the setting asynchronous SR flip-flop.

5. The semiconductor device according to claim 2, wherein the dummy asynchronous SR flip-flop is provided in a plurality of numbers and arranged close to the setting asynchronous SR flip-flop.

6. The semiconductor device according to claim 5, wherein the plurality of dummy asynchronous SR flip-flops are configured to have a characteristic of being easy to be shifted to the reset state that is equivalent to that of the setting asynchronous SR flip-flop.

7. The semiconductor device according to claim 5, wherein each of the plurality of dummy asynchronous SR flip-flops is configured to have characteristics relating to easiness of state-shifting ranged from a characteristic of being easy to be shifted to the non-reset state at power-on to a characteristic of being easy to be shifted to the reset state that is equivalent to that of the setting asynchronous SR flip-flop.

8. The semiconductor device according to claim 2, wherein the dummy asynchronous SR flip-flop is configured to have a characteristic of being easy to be shifted to the reset state that is equivalent to that of the setting asynchronous SR flip-flop, and upon receiving a different set signal at the set terminal, the dummy asynchronous SR flip-flop outputs a different latch signal.

9. The semiconductor device according to claim 1, wherein the setting asynchronous SR flip-flop is configured as a symmetrical flip-flop, while the dummy asynchronous SR flip-flop is configured as an asymmetrical flip-flop which is easy to be shifted to a direction in which the latch signal is reset to the inactive level at power-on.

10. The semiconductor device according to claim 1, wherein said setting asynchronous SR flip-flop comprises first and second NAND circuits, and
wherein a first capacity of a first transistor constituting said first NAND circuit and a second capacity of a second transistor constituting said second NAND circuit are configured asymmetrical to become a reset state at power-on.

11. The semiconductor device according to claim 10, wherein said dummy asynchronous SR flip-flop comprises third and fourth NAND circuits,
wherein a third capacity of a third transistor constituting said third NAND circuit and a fourth capacity of a fourth transistor constituting said fourth NAND circuit are configured as asymmetrical to become a non-reset state at power-on.

12. The semiconductor device according to claim 10, wherein said dummy asynchronous SR flip-flop comprises third and fourth NAND circuits,
wherein a third capacity of a third transistor constituting said third NAND circuit and a fourth capacity of a fourth transistor constituting said fourth NAND circuit are configured to have characteristics relating to easiness of state-shifting ranged from a characteristic of being easy to be shifted to a non-reset state at power-on to a characteristic of being easy to be shifted to the reset state that is equivalent to that of the setting asynchronous SR flip-flop.

13. The semiconductor device according to claim 1, wherein said dummy asynchronous SR flip-flop and the setting asynchronous SR flip-flop are separated by a distance, said distance having a value that results in said dummy asynchronous SR flip-flop and the setting asynchronous SR flip-flop being affected by noise in a same manner.

14. The semiconductor device according to claim 10, wherein said dummy asynchronous SR flip-flop comprises third and fourth NAND circuits,
wherein a third capacity of a third transistor constituting said third NAND circuit and a fourth capacity of a fourth transistor constituting said fourth NAND circuit are configured to have a characteristic of being easy to be shifted to said reset state that is equivalent to that of the setting asynchronous SR flip-flop, and
wherein, upon receiving a different set signal at the set terminal, said dummy asynchronous SR flip-flop outputs a different latch signal.

15. The semiconductor device according to claim 1, wherein said setting asynchronous SR flip-flop comprises first and second NAND circuits,
wherein a first capacity of a first transistor constituting said first NAND circuit and a second capacity of a second transistor constituting the second NAND circuit are configured as symmetrical,
wherein said dummy asynchronous SR flip-flop comprises third and fourth NAND circuits, and
wherein a third capacity of a third transistor constituting said third NAND circuit and a fourth capacity of a fourth transistor constituting said fourth NAND circuit are configured to be asymmetrical to become a non-reset state at power-on.

16. The semiconductor device according to claim 1, wherein said latch signal is reset to an inactive level at power-on by said setting asynchronous SR flip-flop and said dummy asynchronous SR flip-flop.

17. A semiconductor device, comprising:
a setting flip-flop comprising:
    a set terminal that receives a set signal;
    a reset terminal that receives a first reset input based on one of a reset signal and a power-on reset signal; and
    a first output terminal that outputs a first output signal, the first output signal being in a set state in response to an activation of the set signal and in a reset state different from the set state in response to an activation of the reset signal;
a dummy flip-flop comprising:
    a set terminal;
    a reset terminal that receives a second reset input based on one of the reset signal and the power-on reset signal; and
    a second output terminal that outputs a second output signal, the set terminal of the dummy flip-flop being fixed at a constant potential and being free from receiving any signals, the second output signal being in the reset state in response to the activation of the reset signal; and
a logic circuit that receives, as an input, the first and second output signals and outputs a latch signal, the latch signal being deactivated in response to the first output signal being in the reset state or the second output signal being in the set state.

18. A semiconductor device, comprising:
a setting flip-flop comprising a set terminal and a reset terminal, the setting flip-flop including a first NAND and a second NAND, said first NAND and said second NAND being configured so that setting flip-flop outputs a first output signal in a reset state when the semiconductor device is in power-on;
a dummy flip-flop having a set terminal and a reset terminal, the set terminal of the dummy flip-flop being fixed at a constant potential and being free from receiving any signals, the dummy flip-flop including a third NAND and a fourth NAND, said third NAND and said fourth NAND being configured so that the dummy flip-flop outputs a second output signal in a non-reset state that is different from the reset state when the semiconductor device is in power-on; and
a logic circuit that receives, as an input, the first and second output signals, and outputs a latch signal, the latch signal being in the reset state in response to the second output signal being in the non-reset state when the first output signal is in the non-reset state,
wherein the reset terminal of the dummy flip-flop receives a first reset input based on one of the reset signal and a power-on reset signal, and
wherein the reset terminal of the setting flip-flop receives a second reset input based on one of the reset signal and the power-on reset signal.

19. The semiconductor device according to claim 1, further comprising a first NOR circuit, the first NOR receiving the power-on reset signal and the reset signal and providing the first reset input to the reset terminal of the setting asynchronous set-reset SR flip-flop.

20. The semiconductor device according to claim 1, further comprising a second NOR circuit, the first NOR receiving the power-on reset signal and the reset signal and providing the second reset input to the reset terminal of the dummy asynchronous set-reset SR flip-flop.

* * * * *